(12) United States Patent
Huang et al.

(10) Patent No.: US 11,711,888 B2
(45) Date of Patent: Jul. 25, 2023

(54) POWER LINE STRUCTURE

(71) Applicant: Realtek Semiconductor Corporation, Hsinchu (TW)

(72) Inventors: Chun-Ming Huang, Hsinchu (TW); Ruey-Beei Wu, Hsinchu (TW); Shih-Hung Wang, Hsinchu (TW); Ting-Ying Wu, Hsinchu (TW); Ming-Chung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 124 days.

(21) Appl. No.: 17/212,149

(22) Filed: Mar. 25, 2021

(65) Prior Publication Data

US 2021/0368614 A1 Nov. 25, 2021

Related U.S. Application Data

(60) Provisional application No. 63/028,679, filed on May 22, 2020.

(51) Int. Cl.
*H05K 1/02* (2006.01)

(52) U.S. Cl.
CPC . *H05K 1/0216* (2013.01); *H05K 2201/09227* (2013.01)

(58) Field of Classification Search
CPC ............. H05K 1/0216–0228; H05K 2201/093
See application file for complete search history.

(56) References Cited

U.S. PATENT DOCUMENTS

| 9,504,156 | B1* | 11/2016 | Rangan | H01L 23/48 |
| 10,194,524 | B1* | 1/2019 | Park | H05K 1/0218 |
| 10,763,197 | B2* | 9/2020 | Lai | H01L 24/14 |
| 2017/0263567 | A1* | 9/2017 | Moon | H01L 23/4985 |
| 2018/0206339 | A1* | 7/2018 | Chen | H02H 9/046 |
| 2021/0159166 | A1* | 5/2021 | Oikawa | H01L 23/528 |

FOREIGN PATENT DOCUMENTS

TW  I433624 B  4/2014

OTHER PUBLICATIONS

M.-H. Tsai et al., "An on-chip electromagnetic bandgap structure with ESD protection for noise suppression in 16-nm FinFET CMOS," IEEE Microwave and Wireless Components Letters, vol. 27, No. 2, pp. 147-149, 2017.

(Continued)

*Primary Examiner* — Hoa C Nguyen
(74) *Attorney, Agent, or Firm* — Locke Lord LLP; Tim Tingkang Xia, Esq.

(57) ABSTRACT

A power line structure includes a dielectric layer, a first conductive component, a second conductive component, and a third conductive component. The first conductive component is disposed at a first side of the dielectric layer. The second conductive component is disposed at the first side of the dielectric layer. The third conductive component is disposed at the first side of the dielectric layer and between the first conductive component and the second conductive component. Each of the voltage of the first conductive component and the second conductive component is equal to a ground voltage. The third conductive component is configured to receive a first power voltage.

17 Claims, 9 Drawing Sheets

(56) References Cited

OTHER PUBLICATIONS

H.-C. Hsieh et al., "Nonperiodic Flipped EBG for Dual-Band SSN Mitigation in Two-Layer PCB," IEEE Transactions on Components, Packaging and Manufacturing Technology, vol. 9, No. 9, pp. 1690-1697, 2019.

Cheng, Yung-Shou, et al. "Enhanced Microstrip Guard Trace for Ringing Noise Suppression Using a Dielectric Superstrate." IEEE Transactions on Advanced Packaging, vol. 33, No. 4 (2010): 961-968.

Wu, Kai-Bin, et al. "Novel RDL Design of Wafer-Level Packaging For Signal/Power Integrity in LPDDR4 Application." IEEE Transactions on Components, Packaging and Manufacturing Technology, vol. 8, No. 8 (2018): 1431-1439.

* cited by examiner

POWER LINE STRUCTURE

RELATED APPLICATIONS

This application claims priority to U.S. Provisional Application Ser. No. 63/028,679, filed May 22, 2020, which is herein incorporated by reference.

BACKGROUND

Technical Field

The present disclosure relates to a power line structure. More particularly, the present disclosure relates to a power line structure which can reduce electromagnetic interference (EMI).

Description of Related Art

With developments of semiconductor technology, various integrated circuits have been developed. In an integrated circuit, magnetic field coupling effect generated by power lines causes electromagnetic interference (EMI) to other electrical elements. The EMI affects operations and performance of the integrated circuit.

SUMMARY

One embodiment of the present disclosure is related to a power line structure. The power line structure includes a dielectric layer, a first conductive component, a second conductive component, and a third conductive component. The first conductive component is disposed at a first side of the dielectric layer. The second conductive component is disposed at the first side of the dielectric layer. The third conductive component is disposed at the first side of the dielectric layer and between the first conductive component and the second conductive component. Each of the voltage of the first conductive component and the second conductive component is equal to a ground voltage. The third conductive component is configured to receive a first power voltage.

As the above embodiments, the power line structure of the present disclosure can prevent the power line from causing electromagnetic interference (EMI) to other electrical elements.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
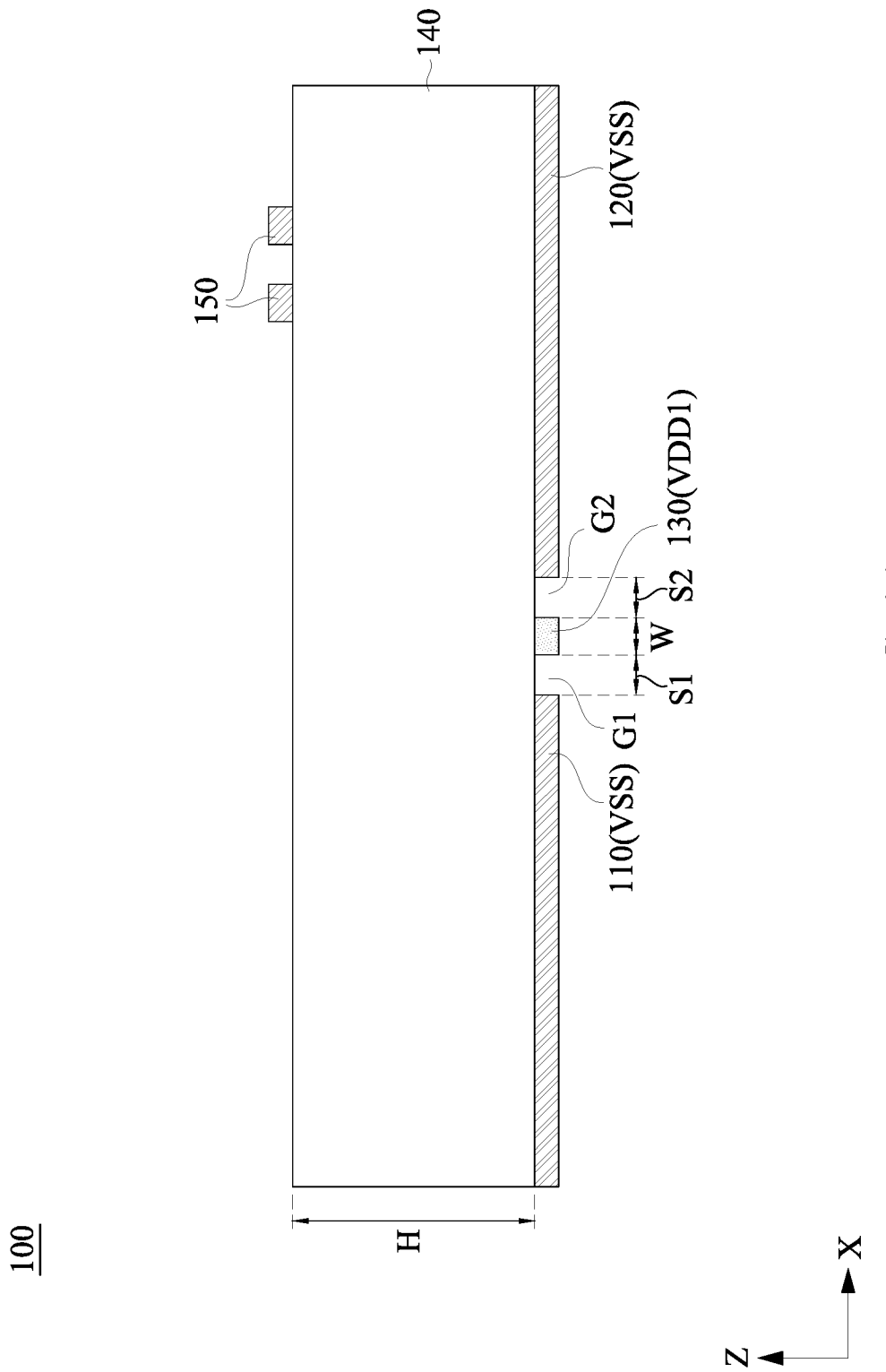
FIG. 1A is a schematic diagram illustrating a power line structure according to some embodiments of the present disclosure.

Reference is made in detail to the present embodiments of the disclosure, examples of which are illustrated in the accompanying drawings. Wherever possible, the same reference numbers are used in the drawings and the description to refer to the same or like parts. The embodiments below are described in detail with the accompanying drawings, but the examples provided are not intended to limit the scope of the disclosure covered by the description. The structure and operation are not intended to limit the execution order. Any structure regrouped by elements, which has an equal effect, is covered by the scope of the present disclosure.

It will be understood that, although the terms first, second, third etc. may be used in the present disclosure to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

In the present disclosure, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Figure 1B:
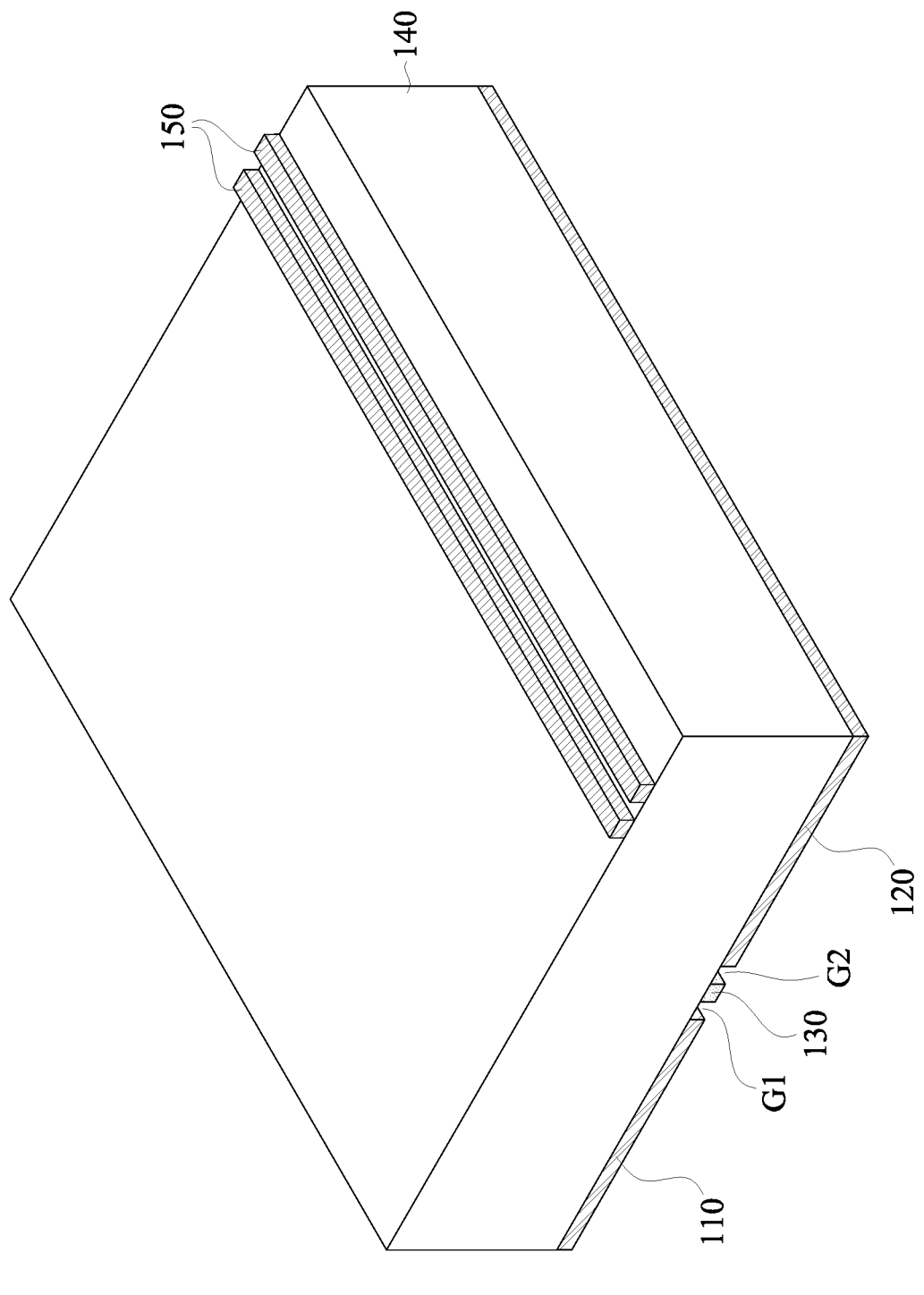
FIG. 1B is a stereogram illustrating the power line structure in FIG. 1A according to some embodiments of the present disclosure.

References are made to FIG. 1A and FIG. 1B. FIG. 1A is a schematic diagram illustrating a power line structure 100 according to some embodiments of the present disclosure. FIG. 1B is a stereogram illustrating the power line structure 100 in FIG. 1A according to some embodiments of the present disclosure.

As illustrated in FIG. 1A and FIG. 1B, the power line structure 100 includes a conductive component 110, a conductive component 120, a conductive component 130, and a dielectric layer 140. In some embodiments, the dielectric layer 140 extends along a plane formed by a direction X and a direction Y. The conductive component 110, the conductive component 120, and the conductive component 130 are disposed at a side of the dielectric layer 140 (for example, a lower side) and touch a first surface (for example, a lower surface) of the dielectric layer 140. In other words, the conductive component 110, the conductive component 120, and the conductive component 130 are disposed at the same side (for example, the lower side) of the dielectric layer 140.

The conductive component 130 is configured to receive a power voltage VDD1 to be a power line. To be more specific, the conductive component 130 may be coupled to other electrical elements to provide the received power voltage VDD1 to the electrical elements. The conductive component 130 is disposed between the conductive component 110 and the conductive component 120. Each of voltages of the conductive component 110 and the conductive component 120 is equal to a ground voltage VSS. In this configuration, the power line structure 100 has an "interleaved structure." The "interleaved structure" indicates that the conductive component 130 for providing the power voltage VDD1 and the conductive components 110/120 with the ground voltage are interleaved.

As illustrated in FIG. 1A and FIG. 1B, a gap G1 is formed by the conductive component 130 and the conductive component 110, and a gap G2 is formed by the conductive component 130 and the conductive component 120. In some embodiments, a width S1 of the gap G1 is equal to a width S2 of the gap G2. In some embodiments, the width S1 of the gap G1 and the width S2 of the gap G2 are equal to a line width W of the conductive component 130. Values of the width S1, the width S2, and the line width W can be designed according to practical applications. In some other embodiments, the width S1 of the gap G1, the width S2 of the gap G2, and the line width W of the conductive component 130 are different from each other.

In some related approaches, a conductive component for providing a power voltage has a plane structure and is disposed on a dielectric layer, and another conductive component with a ground voltage also has a plane structure and is disposed below the dielectric layer. In this configuration, the magnetic field coupling generated by the conductive component for providing the power voltage causes electromagnetic interference (EMI) to other electrical elements.

Compared to the related approaches above, in the power line structure 100 in the present disclosure, the conductive component 130 for providing the power voltage VDD1 and the conductive components 110 and 120 having the ground voltage VSS are disposed at the same side of the dielectric layer 140, and the conductive component 130 for providing the power voltage VDD1 is disposed between the conductive components 110 and 120 having the ground voltage VSS. In this configuration, the magnetic field coupling generated by the conductive component 130 can be confined between the conductive component 110 and the conductive components 120. For example, the magnetic field coupling generated by the conductive component 130 can be confined in the gaps G1 and G2, to prevent the conductive component 130 from causing EMI to other electrical elements. In addition, since the conductive component 130 is disposed the space between the conductive component 110 and the conductive components 120, the volume of the power line structure 100 is not increased significantly.

In some embodiments, the power line structure 100 further includes at least one signal line 150. The signal line 150 is disposed at a second side (for example, an upper side) of the dielectric layer 140 and touches a second surface (for example, an upper surface) of the dielectric layer 140. The signal line 150 can transmit other signals or data in an integrated circuit. It is noted that the power line structure 100 in FIG. 1A includes two signal lines 150, but the present disclosure is not limited this number.

In some embodiments, the conductive component 110, the conductive component 120, the conductive component 130 are disposed in a first metal layer (for example, M1 layer). The signal lines 150 are disposed in a second metal layer (for example, M2 layer). A height between the first metal layer and the second metal layer may be equal to a height H of the dielectric layer 140. The value of the height H can be designed according to practical applications.

Figure 2A:
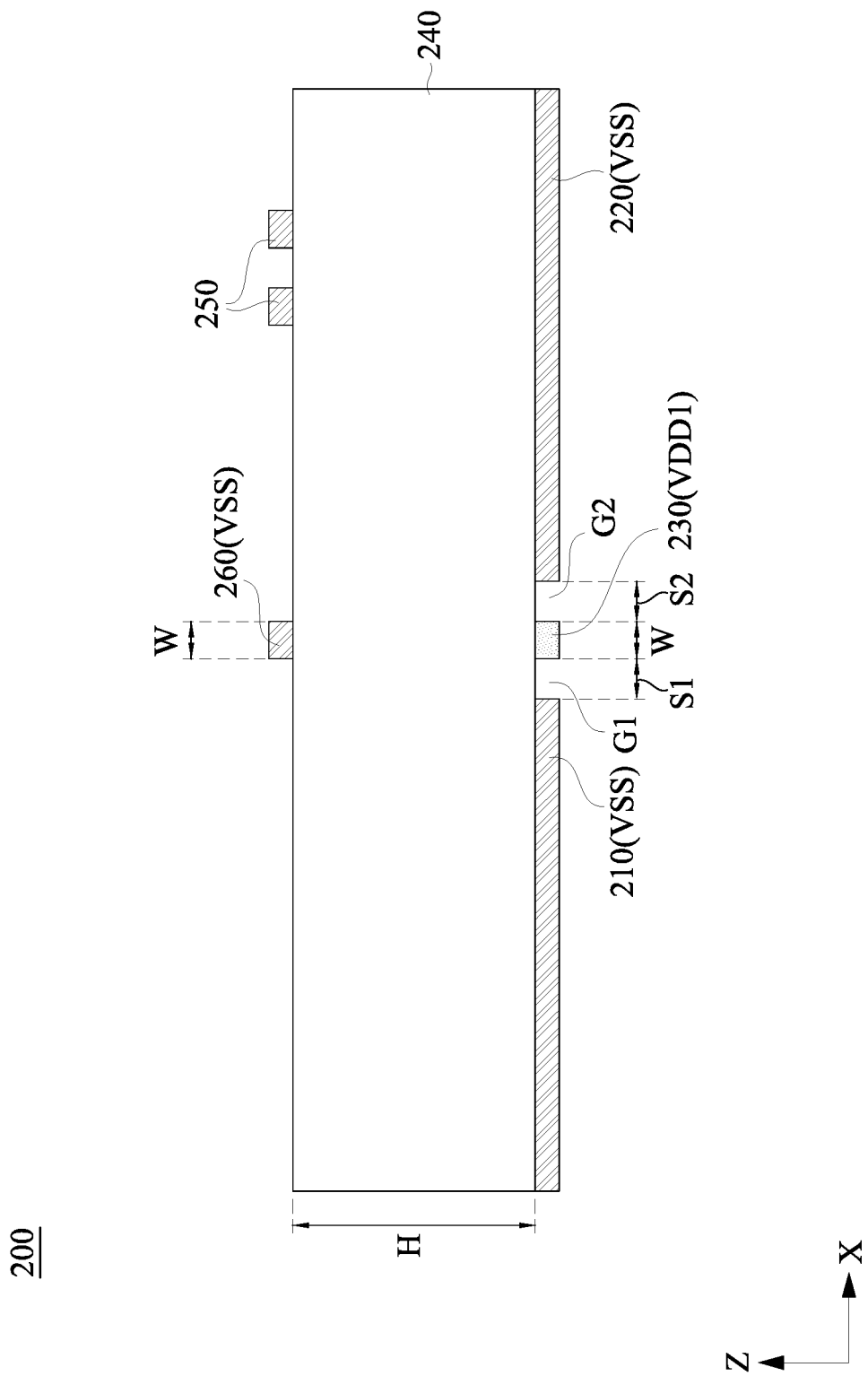
FIG. 2A is a schematic diagram illustrating a power line structure according to some embodiments of the present disclosure.
Figure 2B:
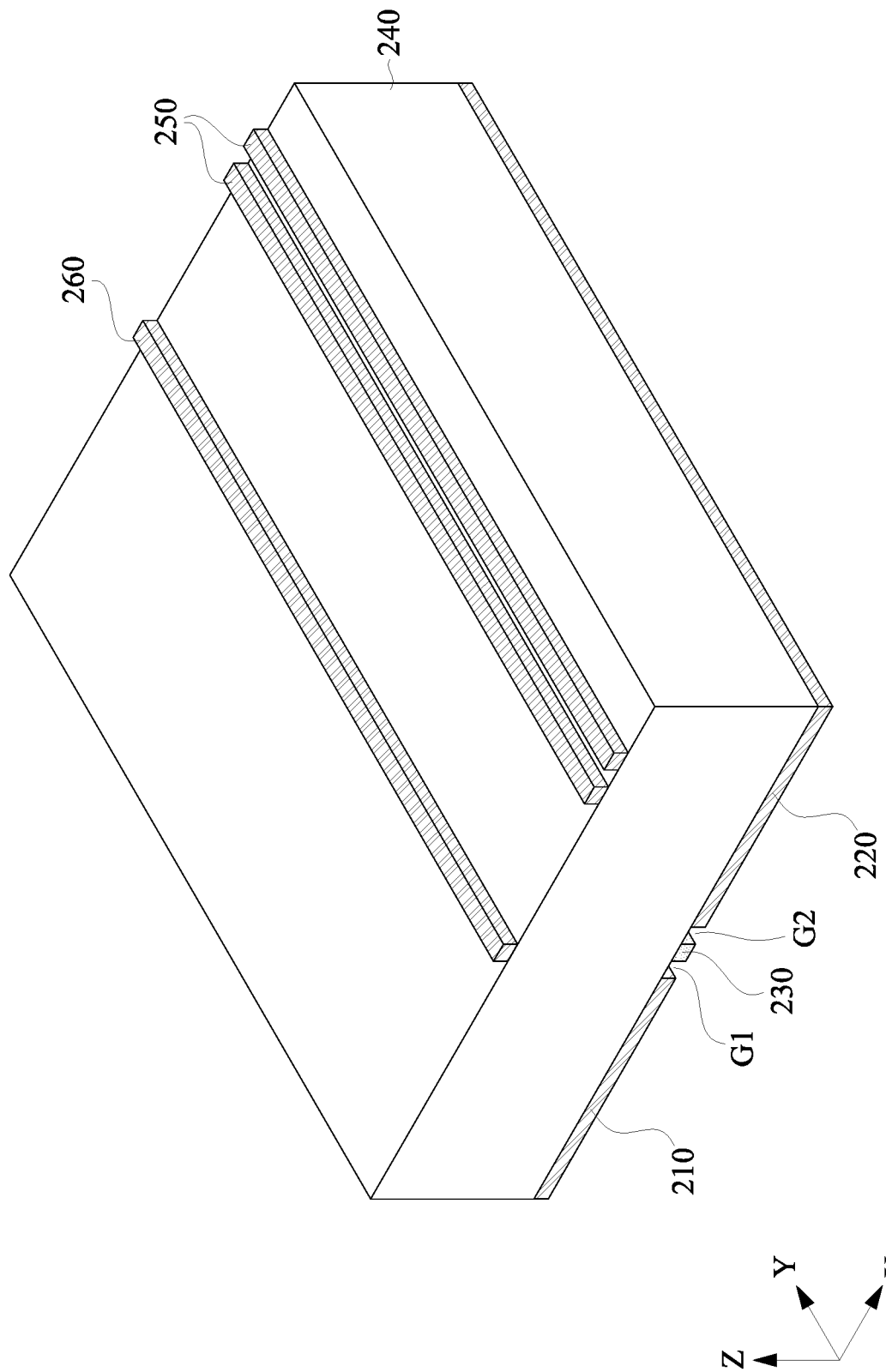
FIG. 2B is a stereogram illustrating the power line structure in FIG. 2A according to some embodiments of the present disclosure.

References are made to FIG. 2A and FIG. 2B. FIG. 2A is a schematic diagram illustrating a power line structure 200 according to some embodiments of the present disclosure. FIG. 2B is a stereogram illustrating the power line structure 200 in FIG. 2A according to some embodiments of the present disclosure. As illustrated in FIG. 2A and FIG. 2B, the power line structure 200 includes a conductive component 210, a conductive component 220, a conductive component 230, a dielectric layer 240, at least one signal line 250, and a conductive component 260.

The conductive component 210, the conductive component 220 and the conductive component 230 are disposed at a first side (for example, a lower side) of the dielectric layer 240 and touch a first surface (for example, a lower surface) of the dielectric layer 240. The at least one signal line 250 and the conductive component 260 are disposed at a second side (for example, an upper side) of the dielectric layer 240 and touch a second surface (for example, an upper surface) of the dielectric layer 240. The conductive component 230 is configured to receive a power voltage VDD1 to be a power line. To be more specific, the conductive component 230 may be coupled to other electrical elements to provide the received power voltage VDD1 to the electrical elements. Each of voltages of the conductive component 210, the conductive component 220, and the conductive component 260 is equal to a ground voltage VSS. In other words, the voltages of the conductive component 210, the conductive component 220, and the conductive component 260 are the same.

Similar to FIG. 1A, a gap G1 is formed between the conductive component 230 and the conductive component 210, and a gap G2 is formed between the conductive component 230 and the conductive component 220. The magnetic field coupling generated by the conductive component 230 is confined between the conductive component 210 and the conductive component 220. In other words, the magnetic field coupling generated by the conductive component 230 is confined in the gap G1 and the gap G2, to prevent the conductive component 230 from causing EMI to other electrical elements. In some embodiments, a width S1 of the gap G1 is equal to a width S2 of the gap G2. In some embodiments, the width S1 of the gap G1 and the width S2 of the gap G2 are equal to a width W of the conductive component 230 or the conductive component 260. In some other embodiments, the line width of the conductive component 230 may be not equal to the line width of the conductive component 260. Values of the width S1, the width S2, and the line width W can be designed according to practical applications.

As illustrated in FIG. 2A, the conductive component 260 and the conductive component 230 are aligned in a direction Z, in which the direction Z is perpendicular to a direction X and a direction Y. To be more specific, a vertical projection, on a plane formed by the directions X and Y, of the conductive component 260 overlaps completely with a vertical projection, on the plane, of the conductive component 230. In some other embodiments, the vertical projection, on the plane formed by the directions X and Y, of the conductive component 260 overlaps partially with the vertical projection, on the plane, of the conductive component 230.

In some embodiments, the conductive component 210, the conductive component 220, and the conductive component 230 are disposed in a first metal layer (for example, M1 layer). The signal lines 250 and the conductive component 260 are disposed in a second metal layer (for example, M2 layer). A distance between the first metal layer and the second metal layer may be equal to a height H of the dielectric layer 240. The value of the height H can be designed according to practical applications.

Compared to the power line structure 100 in FIG. 1A, the power line structure 200 in FIG. 2A further includes the conductive component 260 having the ground voltage VSS, and the conductive component 260 is disposed with respective to the conductive component 230 for providing the power voltage VDD1 (for example, the conductive component 260 and the conductive component 230 aligned in the direction Z), so the magnetic field coupling generated by the conductive component 230 can be confined more effectively. To be more specific, the magnetic field coupling generated by the conductive component 230 can be confined in the space among the conductive component 210, the conductive component 220, and the conductive component 260.

Figure 2C:
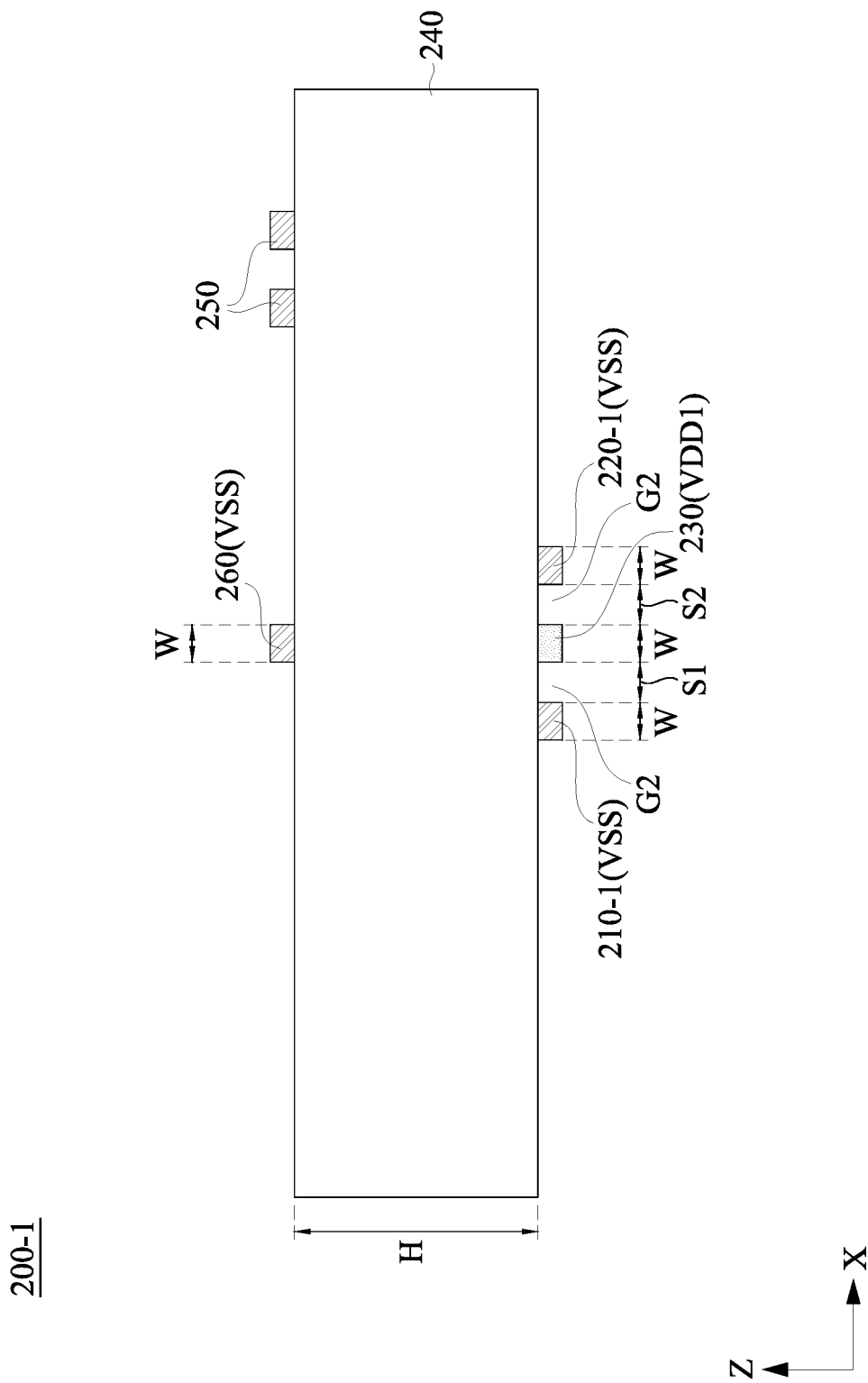
FIG. 2C is a schematic diagram illustrating a power line structure according to some embodiments of the present disclosure.

Reference is made to FIG. 2C. FIG. 2C is a schematic diagram illustrating a power line structure 200-1 according to some embodiments of the present disclosure. A main difference between the power line structure 200-1 in FIG. 2C and the power line structure 200 in FIG. 2A is that, in the power line structure 200-1 in FIG. 2C, all of a conductive component 210-1, a conductive component 220-1, and the conductive component 230 have the width W.

In some embodiments, the width of the conductive component 210-1, the width of the conductive component 220-1, and the width of the conductive component 230 can be designed according to practical applications respectively.

Figure 3A:
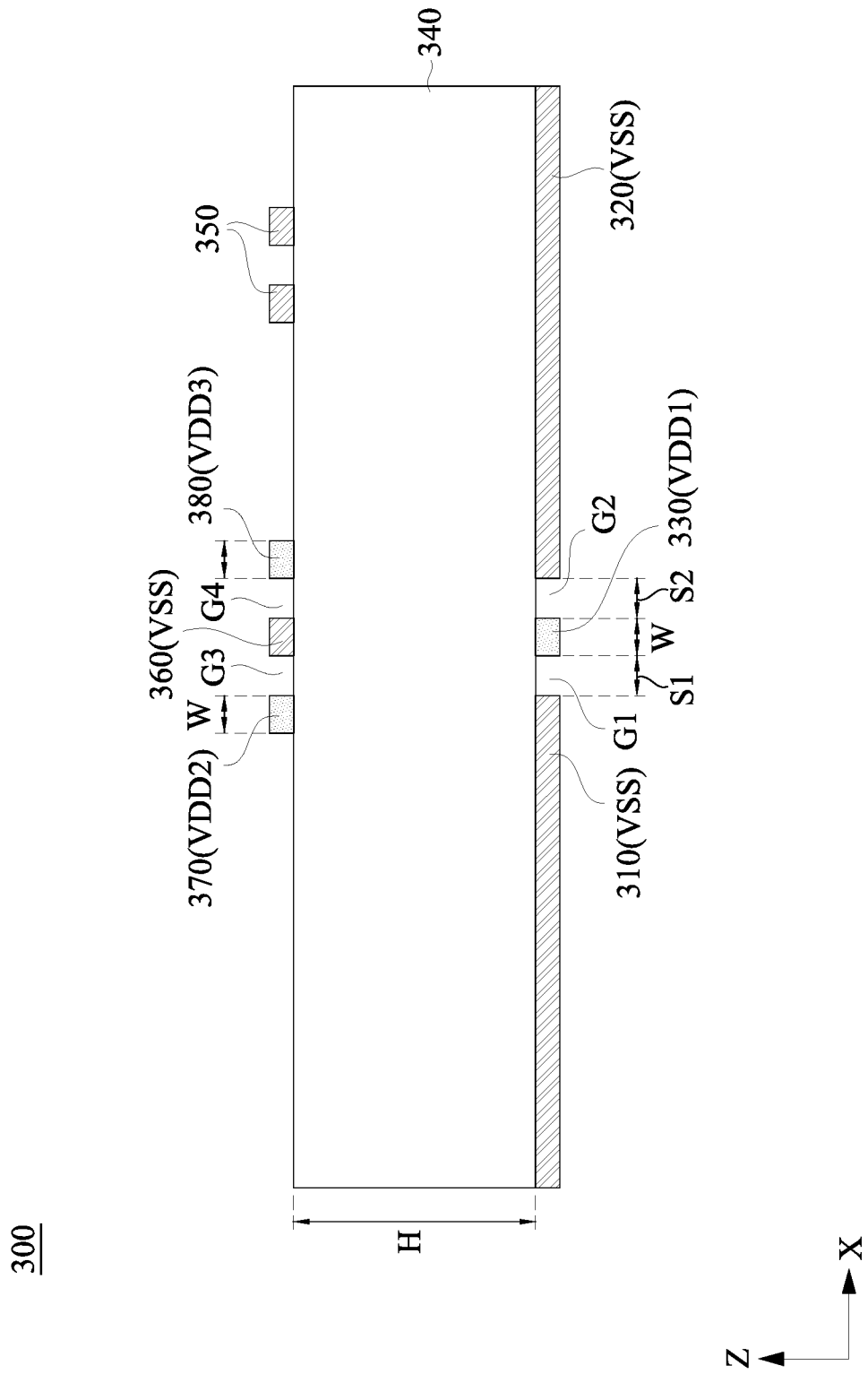
FIG. 3A is a schematic diagram illustrating a power line structure according to some embodiments of the present disclosure.

Reference is made to FIG. 3A. FIG. 3A is a schematic diagram illustrating a power line structure 300 according to some embodiments of the present disclosure. As illustrated in FIG. 3A, the power line structure 300 includes a conductive component 310, a conductive component 320, a conductive component 330, a dielectric layer 340, signal lines 350, a conductive component 360, a conductive component 370, and a conductive component 380.

The configurations of the conductive component 310, the conductive component 320, the conductive component 330, the dielectric layer 340, the signal lines 350, and the conductive component 360 in FIG. 3A are similar to the configurations of the conductive component 210, the conductive component 220, the conductive component 230, the dielectric layer 240, the signal lines 250, and the conductive component 260 in FIG. 2A, so they are not described herein again.

The conductive component 370 and the conductive component 380 are disposed at a second side (for example, an upper side) of the dielectric layer 340 and touch a second surface (for example, an upper surface) of the dielectric layer 340. The conductive component 370 is configured to receive a power voltage VDD2 to be a power line. To be more specific, the conductive component 370 may be coupled to other electrical elements to provide the received power voltage VDD2 to the electrical elements. The conductive component 380 is configured to receive a power voltage VDD3 to be another power line. To be more specific, the conductive component 380 may be coupled to other electrical elements to provide the received power voltage VDD3 to the electrical elements. In some embodiments, the power voltage VDD2 or the power voltage VDD3 is equal to the power voltage VDD1. In some other embodiments, the power voltage VDD2 and the power voltage VDD3 are not equal to the power voltage VDD1.

Since the power line structure 300 in FIG. 3A further includes the conductive components 370 and 380 configured to be the additional power lines, the power line structure 300 in FIG. 3A can be applied to applications requiring more power sources. In some embodiments, a line width W of the conductive component 370 for providing the power voltage VDD2 or a line width W of the conductive component 380 for providing the power voltage VDD3 is equal to a line width W of the conductive component 330 for providing the power voltage VDD1. In some embodiments, the line width of the conductive component 370 for providing the power voltage VDD2 or the line width of the conductive component 380 for providing the power voltage VDD3 is not equal to the line width of the conductive component 330 for providing the power voltage VDD1.

In some embodiments, a gap G1 is formed between the conductive component 330 and the conductive component 310, and a gap G2 is formed between the conductive component 330 and the conductive component 320. The magnetic field coupling generated by the conductive component 330 is confined between the conductive component 310 and the conductive component 320. In other words, the magnetic field coupling generated by the conductive component 330 is confined in the gap G1 and the gap G2, to prevent the conductive component 330 from causing EMI to other electrical elements. In some embodiments, a width S1 of the gap G1 is equal to a width S2 of the gap G2. In some embodiments, the width S1 of the gap G1 and the width S2 of the gap G2 are equal to a line width W of the conductive component 330. Values of the width S1, the width S2, and the line width W can be designed according to practical applications.

In addition, a gap G3 is formed between the conductive component 360 and the conductive component 370, and a gap G4 is formed between the conductive component 360 and the conductive component 380. As illustrated in FIG. 3A, the conductive component 360 and the conductive component 330 are aligned in a direction Z, the conductive component 370 and the conductive component 310 are aligned in the direction Z, and the conductive component 380 and the conductive component 320 are aligned in the direction Z. To be more specific, a vertical projection, on a plane formed by the directions X and Y, of the conductive component 360 overlaps completely with a vertical projection, on the plane, of the conductive component 330. A vertical projection, on a plane formed by the directions X and Y, of the conductive component 370 overlaps completely with a vertical projection, on the plane, of the conductive component 310. A vertical projection, on a plane formed by the directions X and Y, of the conductive component 380 overlaps completely with a vertical projection, on the plane, of the conductive component 320. In some other embodiments, the vertical projection, on the plane formed by the directions X and Y, of the conductive component 360 (370/380) overlaps partially with the vertical projection, on the plane, of the conductive component 330 (310/320).

Similarly, compared to the power line structure 100 in FIG. 1, the power line structure 300 in FIG. 3A further includes the conductive component 360 having the ground voltage VSS, so the magnetic field coupling generated by the conductive component 330 is confined more effectively. To be more specific, the magnetic field coupling generated by the conductive component 330 can be confined in the space among the conductive component 310, the conductive component 320, and the conductive component 360.

Figure 3B:
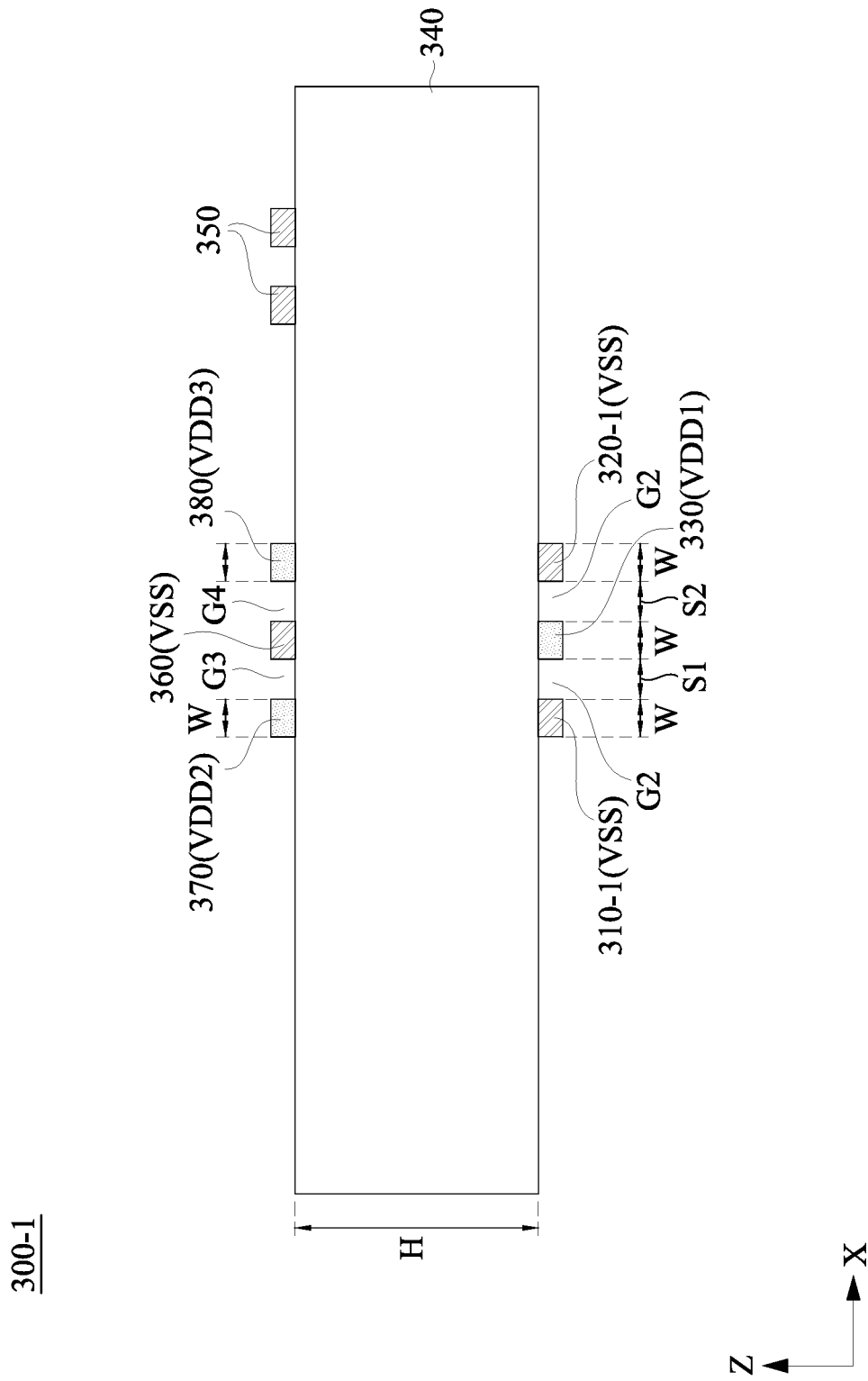
FIG. 3B is a schematic diagram illustrating a power line structure according to some embodiments of the present disclosure.

Reference is made to FIG. 3B. FIG. 3B is a schematic diagram illustrating a power line structure 300-1 according to some embodiments of the present disclosure. A main difference between the power line structure 300-1 in FIG. 3B and the power line structure 300 in FIG. 3A is that, in the power line structure 300-1 in FIG. 3B, all of a conductive component 310-1, a conductive component 320-1, and the conductive component 330 have the width W.

In some embodiments, the width of the conductive component 310-1, the width of the conductive component 320-1, and the width of the conductive component 330 can be designed according to practical applications respectively.

Figure 4A:
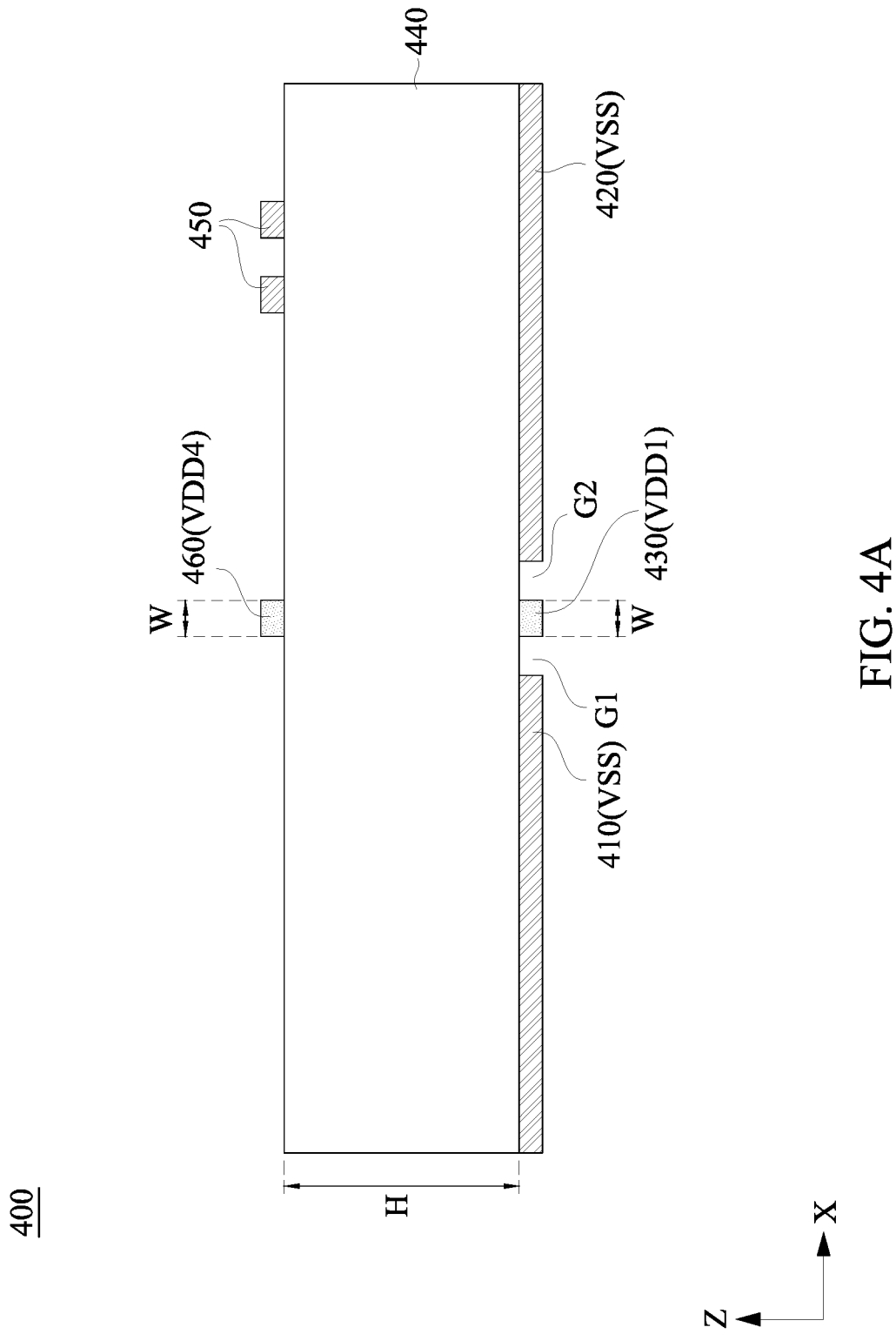
FIG. 4A is a schematic diagram illustrating a power line structure according to some embodiments of the present disclosure.

Reference is made to FIG. 4A. FIG. 4A is a schematic diagram illustrating a power line structure 400 according to some embodiments of the present disclosure. As illustrated in FIG. 4A, the power line structure 400 includes a conductive component 410, a conductive component 420, a conductive component 430, a dielectric layer 440, signal lines 450, and a conductive component 460.

The configurations of the conductive component 410, the conductive component 420, the conductive component 430, the dielectric layer 440, and the signal lines 460 in FIG. 4A are similar to the conductive component 210, the conductive component 220, the conductive component 230, the dielectric layer 240, and the signal lines 250 in FIG. 2, so they are not described herein again.

The conductive component 460 in FIG. 4A is disposed at a second side (for example, an upper side) of the dielectric layer 440 and touches a second surface (for example, an upper surface) of the dielectric layer 440. The conductive component 460 is configured to receive a power voltage VDD4 to be another power line. To be more specific, the conductive component 460 may be coupled to other electrical elements to provide the received power voltage VDD4 to the electrical elements. In some embodiments, the power voltage VDD4 is equal to the power voltage VDD1. In some other embodiments, the power voltage VDD4 is not equal to the power voltage VDD1.

As illustrated in FIG. 4A, the conductive component 460 and the conductive component 430 are aligned in a direction Z. To be more specific, a vertical projection, on a plane formed by directions X and Y, of the conductive component 460 overlaps completely with a vertical projection, on the plane, of the conductive component 430. In some other embodiments, the vertical projection, on the plane formed by the directions X and Y, of the conductive component 460 overlaps partially with the vertical projection, on the plane, of the conductive component 430.

In the power line structure 400 in FIG. 4A, the conductive component 410 and the conductive component 420 having the ground voltage VSS can confine the magnetic field coupling generated by the conductive component 430, and the conductive component 460 can provide another power voltage VDD4 to other electrical elements.

Figure 4B:
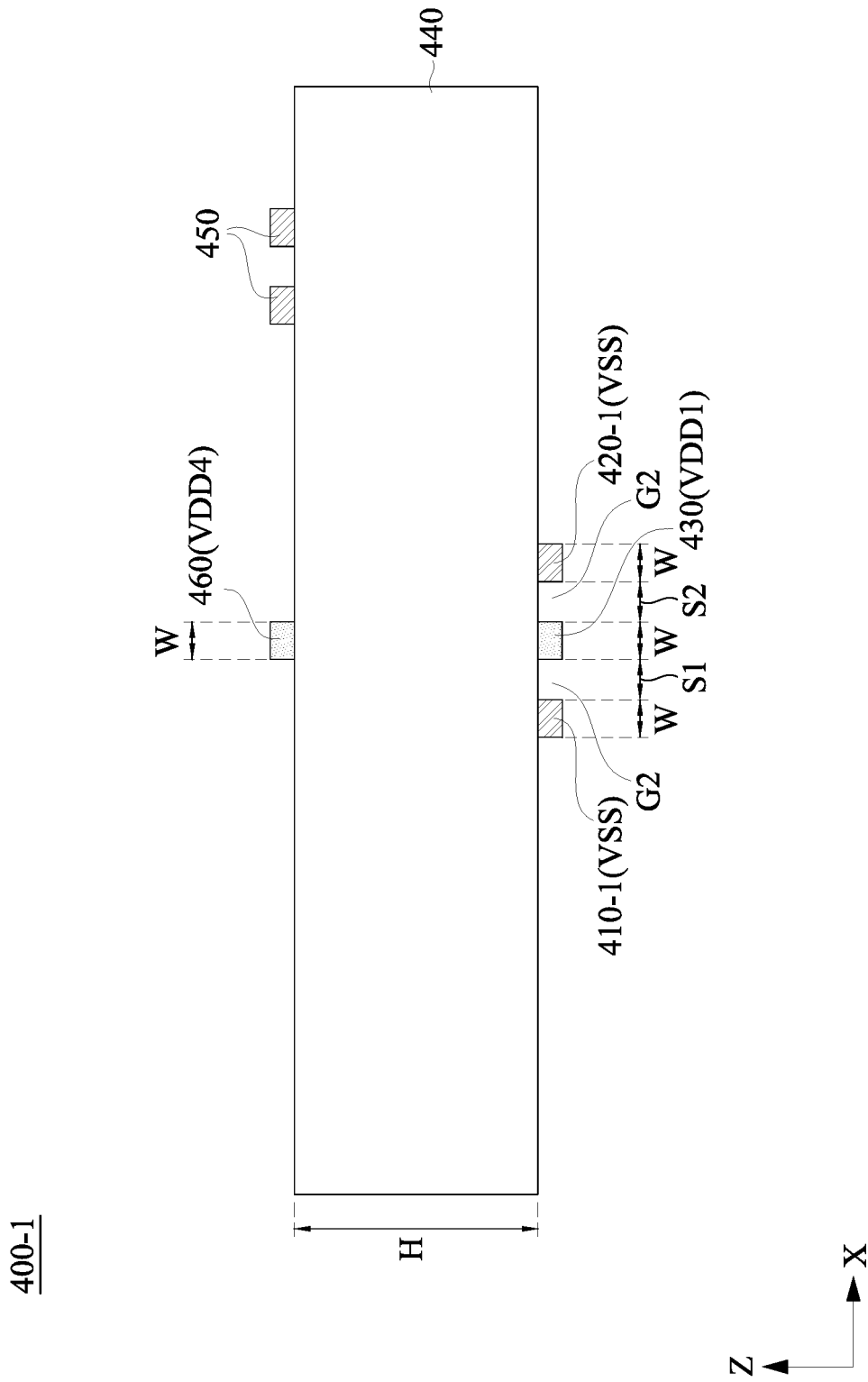
FIG. 4B is a schematic diagram illustrating a power line structure according to some embodiments of the present disclosure.

Reference is made to FIG. 4B. FIG. 4B is a schematic diagram illustrating a power line structure 400-1 according to some embodiments of the present disclosure. A main difference between the power line structure 400-1 in FIG. 4B and the power line structure 400 in FIG. 4A is that, in the power line structure 400-1 in FIG. 4B, all of a conductive component 410-1, a conductive component 420-1, and the conductive component 430 have the width W.

In some embodiments, the width of the conductive component 410-1, the width of the conductive component 420-1, and the width of the conductive component 430 can be designed according to practical applications respectively.

As the above embodiments, the power line structure of the present disclosure can prevent the power line from causing EMI to other electrical elements.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A power line structure, comprising:
a dielectric layer;
a first conductive component disposed at a first side of the dielectric layer;
a second conductive component disposed at the first side of the dielectric layer;
a third conductive component disposed at the first side of the dielectric layer, and disposed between the first conductive component and the second conductive component, wherein each of voltages of the first conductive component and the second conductive component is equal to a ground voltage, and the third conductive component is configured to receive a first power voltage;
a fourth conductive component disposed at a second side of the dielectric layer and is disposed with respective to the third conductive component, wherein a voltage of the fourth conductive component is equal to the ground voltage;
a fifth conductive component disposed at the second side of the dielectric layer and configured to receive a second power voltage; and
a sixth conductive component disposed at the second side of the dielectric layer and configured to receive a third power voltage different from the second power voltage, wherein a line width of the first conductive component is different from a line width of the third conductive component.

2. The power line structure of claim 1, wherein a first gap is formed between the third conductive component and the first conductive component, and a second gap is formed between the third conductive component and the second conductive component.

3. The power line structure of claim 2, wherein a width of the first gap is equal to a width of the second gap.

4. The power line structure of claim 3, wherein a width of the first gap is equal to the line width of the third conductive component.

5. The power line structure of claim 4, further comprising:
a signal line disposed at a second side of the dielectric layer.

6. The power line structure of claim 2, wherein a width of the first gap is different from a width of the second gap.

7. The power line structure of claim 6, wherein a width of the first gap is different from the line width of the third conductive component.

8. The power line structure of claim 1, wherein the fourth conductive component and the third conductive component are aligned in a first direction.

9. The power line structure of claim 8, wherein the dielectric layer extends along a plane formed by a second direction and a third direction, wherein a vertical projection, on the plane, of the fourth conductive component overlaps with a vertical projection, on the plane, of the third conductive component, wherein the second direction and the third direction are perpendicular to the first direction.

10. The power line structure of claim 9, further comprising:
a signal line disposed at the second side of the dielectric layer.

11. The power line structure of claim 1, wherein a first gap is formed between the third conductive component and the first conductive component, a second gap is formed between the third conductive component and the second conductive component, a third gap is formed between the fifth conductive component and the fourth conductive component, and a fourth gap is formed between the sixth conductive component and the fourth conductive component.

12. The power line structure of claim 1, wherein the fifth conductive component and the first conductive component are aligned in a first direction, and the sixth conductive component and the second conductive component are aligned in the first direction.

13. The power line structure of claim 12, wherein the dielectric layer extends along a plane formed by a second direction and a third direction, wherein a vertical projection, on the plane, of the fifth conductive component overlaps with a vertical projection of the first conductive component, wherein a vertical projection, on the plane, of the sixth conductive component overlaps with a vertical projection, on the plane, of the second conductive component, wherein the second direction and the third direction are perpendicular to the first direction.

14. The power line structure of claim 13, further comprising:
a signal line disposed at the second side of the dielectric layer.

15. The power line structure of claim 1, wherein the line width of the first conductive component is equal to a line width of the second conductive component.

16. A power line structure, comprising:
a dielectric layer;
a first conductive component disposed at a first side of the dielectric layer;
a second conductive component disposed at the first side of the dielectric layer;
a third conductive component disposed at the first side of the dielectric layer, and disposed between the first conductive component and the second conductive component, wherein each of voltages of the first conductive component and the second conductive component is equal to a ground voltage, and the third conductive component is configured to receive a first power voltage; and
a fourth conductive component disposed at a second side of the dielectric layer, wherein the fourth conductive component and the third conductive component are aligned in a first direction, wherein the dielectric layer extends along a plane formed by a second direction and a third direction, wherein the second direction and the third direction are perpendicular to the first direction, wherein the fourth conductive component is configured to receive a second power voltage different from the first power voltage,
wherein a line width of the first conductive component is different from a line width of the third conductive component.

17. The power line structure of claim 16, wherein a vertical projection, on the plane, of the fourth conductive component overlaps with a vertical projection, on the plane, of the third conductive component.

* * * * *